United States Patent
Lu et al.

(10) Patent No.: US 7,042,106 B2
(45) Date of Patent: May 9, 2006

(54) UNDERFILL INTEGRATION FOR OPTICAL PACKAGES

(75) Inventors: Daoqiang Lu, Chandler, AZ (US); Steven Towle, deceased, late of Phoenix, AZ (US); by Anna M. George, legal representative, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 10/606,092

(22) Filed: Jun. 24, 2003

(65) Prior Publication Data
US 2004/0266062 A1  Dec. 30, 2004

(51) Int. Cl.
*H01L 23/29* (2006.01)

(52) U.S. Cl. .................................... 257/789
(58) Field of Classification Search ............. 257/789; 438/26
See application file for complete search history.

(56) References Cited

U.S. PATENT DOCUMENTS

| | | | |
|---|---|---|---|
| 6,571,466 B1 * | 6/2003 | Glenn et al. | 29/841 |
| 6,661,939 B1 * | 12/2003 | Kaneko et al. | 385/14 |
| 6,693,364 B1 * | 2/2004 | Tao et al. | 257/783 |
| 6,724,961 B1 * | 4/2004 | Greene et al. | 385/52 |
| 6,800,946 B1 * | 10/2004 | Chason et al. | 257/778 |
| 6,868,207 B1 * | 3/2005 | Wickman | 385/37 |
| 2002/0058742 A1 * | 5/2002 | Honda et al. | 524/492 |
| 2004/0118599 A1 * | 6/2004 | Chason et al. | 174/260 |

* cited by examiner

*Primary Examiner*—W. David Coleman
(74) *Attorney, Agent, or Firm*—Blakely, Sokoloff, Taylor & Zafman LLP

(57) ABSTRACT

The application discloses an apparatus comprising an optical die flip-chip bonded to a substrate and defining a volume between the optical die and the substrate, the optical die including an optically active area on a surface of the die facing the substrate, an optically transparent material occupying at least those portions of the volume substantially corresponding with the optically active area, and an underfill material occupying portions of the volume not occupied by the optically transparent material. Also disclosed is a process comprising flip-chip bonding an optical die to a substrate, the optical die including at least one optically active area on a surface thereof facing the substrate, dispensing an optically transparent material between the optical die and the substrate, wherein the optically transparent material covers the at least one optically active area, dispensing an underfill material in the volume between the optical die and the substrate not occupied by the optically transparent material, and curing the optically transparent material and the underfill material. Other embodiments are described and claimed.

26 Claims, 5 Drawing Sheets

UNDERFILL INTEGRATION FOR OPTICAL PACKAGES

TECHNICAL FIELD

The present invention relates generally to flip-chip bonding and in particular, but not exclusively, to integration of flip-chip bonded optical packages.

BACKGROUND

Flip-chip bonding is a well-known technology in which semiconductor dies or packages are turned upside down and attached to a substrate (e.g., a semiconductor wafer or printed circuit board (PCB)) using solder balls or joints instead of being attached in more conventional ways, such as being placed right side up and attached to a substrate using perimeter bonding wires. FIG. 1 illustrates a flip-chip bonded configuration 100, in which a die 102 is mounted to a substrate 106 via flip-chip bonding. The die 102 is suspended above the substrate 106, is affixed to the substrate by a plurality of solder balls 110, and has a lower surface 104 facing the substrate, creating a volume 105 between the surface 104 of the die and the substrate surface 108.

One common problem with flip-chip bonding occurs due to differential thermal expansion between the substrate 106 and the die 102. In many devices, the substrate 106 has a coefficient of thermal expansion that is substantially different than the coefficient of thermal expansion of the die 102. As with most semiconductor devices, when the device 100 operates it experiences a substantial increase in temperature; the temperature rise is directly related to the amount of electrical energy used by the device, which is eventually turned into heat. The differences in coefficient of thermal expansion between the die and the substrate, coupled with large temperature increases, result in substantially different amounts of thermal expansion and contraction in the substrate and the die. Since the die is rigidly connected to the substrate by the plurality of solder balls 110, the loads created by the differential thermal expansions are carried entirely by the solder balls. Because the solder balls 110 are typically very small, the result is a high stress concentration in the solder balls. These stress concentrations can result in premature failure of the solder balls and, consequently, premature failure of the entire device 100.

FIG. 2 illustrates one approach that has been used to reduce the problems caused by differential thermal expansion of the die and the substrate. In this approach, a material known as an "underfill" 202 is dispensed into the volume defined by the lower surface 104 of the die and the upper surface 108 of the substrate 106. The underfill material 202 is fairly rigid when cured, such that by filling the volume 105 with underfill material any loads arising from the differential thermal expansion of the substrate and the die, as well as any other mechanical forces that may be applied to the die, are transferred into both the solder balls and the underfill material. Since the applied loads are now carried over a substantially larger area (i.e., the area of the solder balls plus the area of the underfill material), the resulting stresses are lower and stress concentrations at the solder balls are eliminated.

Although the approach of using underfill is beneficial, it suffers from some disadvantages. Among those disadvantages is that the underfill approach is incompatible with dies including optical devices. Underfill materials are typically opaque, and therefore cannot be used in devices having optically active areas on the lower side 104 of the substrate because the underfill material would absorb any radiation radiating from or being received by an optically active area on the lower side 104 of the die, thus rendering useless the optically active area. In addition, most optical devices that would be used for the optically active area are very delicate. Since underfill materials are designed to be rigid (e.g., having a modulus of elasticity, or Young's modulus, of 7–10 GPa) so they can take up thermal and other loads, the underfill material will transfer loads to the optically active area and can damage the area.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of a apparatus and method for underfill integration of optical packages are described herein. In the following description, numerous specific details are described to provide a thorough understanding of embodiments of the invention. One skilled in the relevant art will recognize, however, that the invention can be practiced without one or more of the specific details, or with other methods, components, materials, etc. In some instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1:
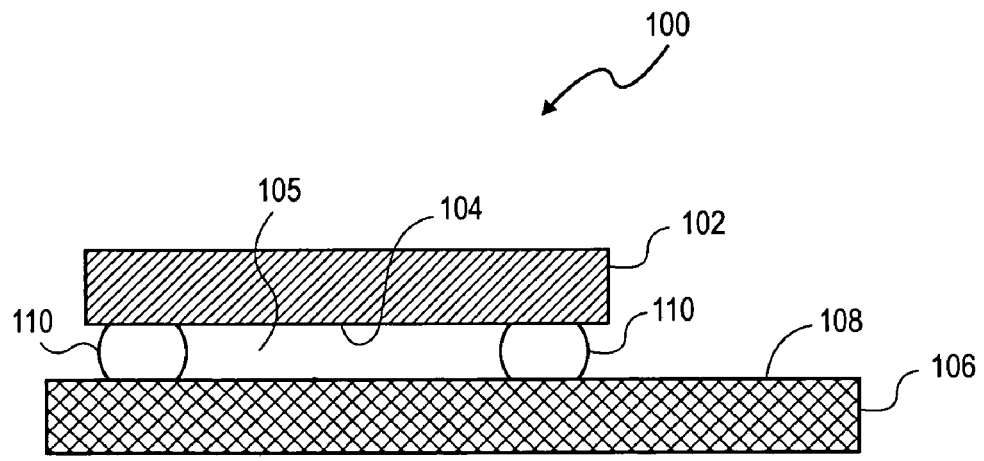
FIG. 1 is a side elevation drawing of a die flip-chip bonded onto a substrate, such as a printed circuit board.
Figure 2:
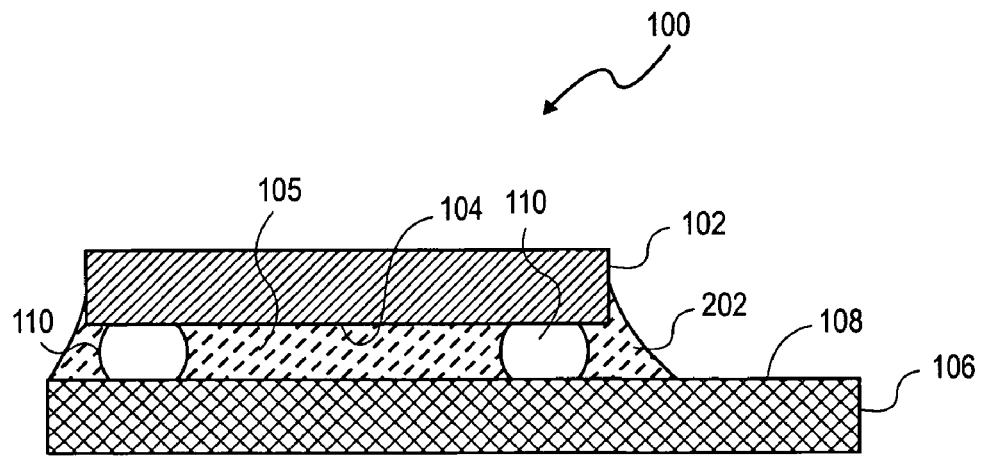
FIG. 2 is a side elevation drawing of die flip-chip bonded onto a substrate and including an underfill material sandwiched between the die and the substrate.
Figure 3A:
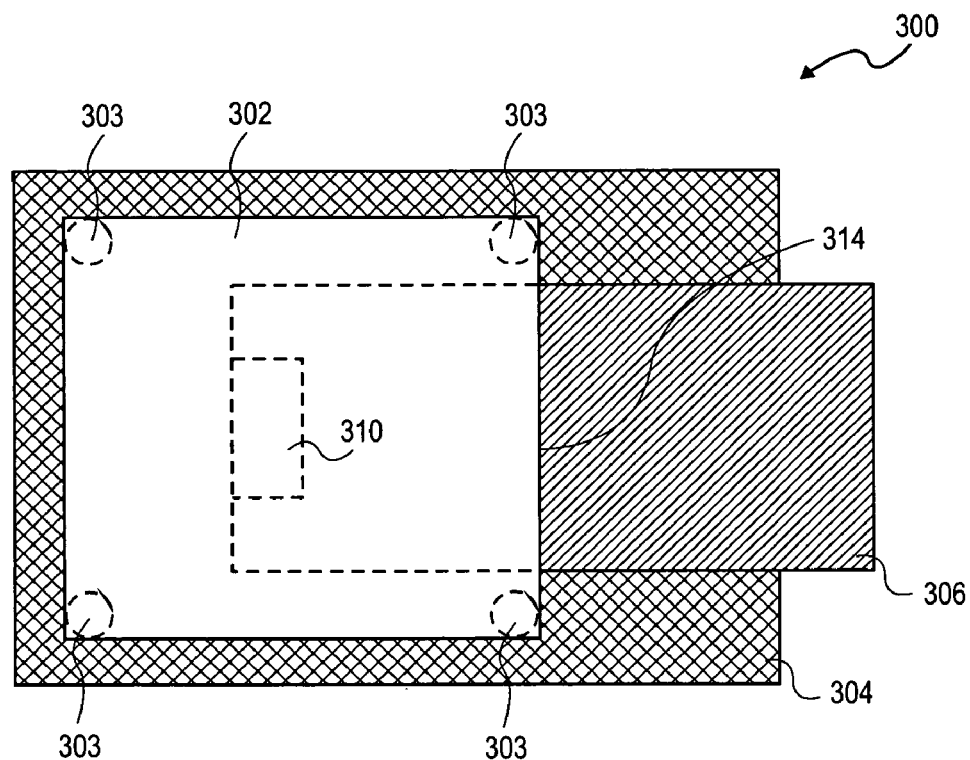
FIG. 3A is a plan view drawing of an optical device including an optical die flip-chip bonded onto a substrate.
Figure 3B:
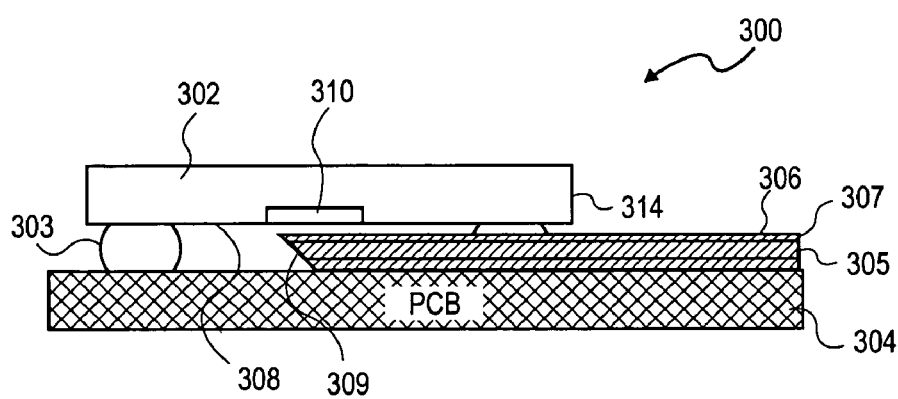
FIG. 3B is a side elevation drawing of an optical device including an optical die flip-chip bonded onto a substrate.

FIGS. 3A and 3B illustrate an embodiment of an optical device 300. As seen in plan view in FIG. 3A, the optical device 300 comprises an optical die 302 flip chip bonded to a substrate 304 using solder ball joints 303. An optical component such as a waveguide 306 is inserted between the optical die 302 and the substrate 304, and occupies at least part of the volume between the optical die 302 and the substrate 304. In addition to having a portion extending underneath the die 302, a portion of the waveguide projects from underneath the die 302 and extends, for example, to another component (see FIG. 5) to form an optical interconnect between components.

The optical die 302 is affixed to the substrate 304 using solder ball joints 303, which both attach the optical die 302 to the substrate 304 and suspend the optical die above the substrate, such that there is a volume defined in part by the substrate 302 and the surface 308 of the die facing the substrate. The optical die 302 includes at least one optically active area 310 on the surface 308. Examples of optically active components that can be found on the die 302 include radiation sources such as a vertical cavity surface emitting laser (VCSEL), or photo-detectors such as PINs, photodiodes and the like. Other embodiments can, of course, include more, less or different optically active areas than those listed. Similarly, other embodiments could include additional optically active areas positioned on other surfaces of the optical die 302, for example on the surface of the die not facing the substrate.

The waveguide 306 is positioned so that at least a portion of the waveguide occupies at least part of the volume between the substrate 304 and the lower surface 308 of the optical die. The remaining portion of the waveguide projects out from under an edge 314 of the optical die 302 and can extend, for example, to another optical die (see FIG. 5) to form an optical interconnect between optical dies. The width of the waveguide is such that it fits between a pair of the solder ball joints 303. Although only one waveguide is illustrated, in other embodiments multiple waveguides could be used. For example, multiple waveguides can be used to carry signals in different directions to or from a single optically active area 310, or multiple waveguides can be used to carry multiple signals to and from multiple optically active areas.

FIG. 3B illustrates a side elevation of the optical device 300 shown in plan view in FIG. 3A. The waveguide 306 comprises an optically transparent portion 305 surrounded by cladding 307. A portion of the waveguide 306 is positioned in the volume between surface 308 of the optical die 302 and the substrate, such that its highly polished angled end 309 is positioned to either receive radiation from the optically active area 310 and reflect it into the optically transparent portion 305 of the waveguide (e.g., where the optically active area is a radiation source), or to receive radiation from the optically transparent portion of the waveguide and reflect it into the optically active area 310 (e.g., where the optically active area 310 is a radiation detector). The remaining portion of the waveguide projects out from under an edge 314 of the optical die 302 and can extend, for example, to another optical die (not shown) to form an optical interconnect between optical dies.

Figure 4A:
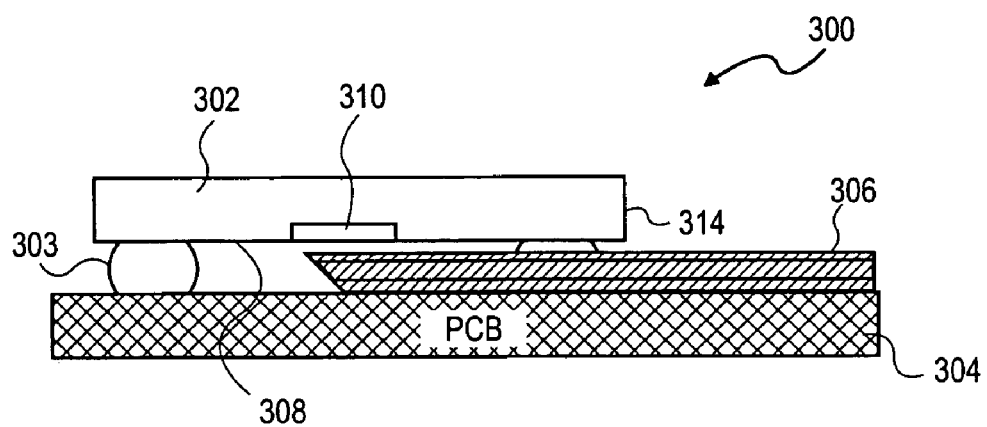
FIGS. 4A–4D are side elevation drawings of an embodiment of an inventive process for integrating a flip-chip bonded die to a substrate using underfill techniques.

FIGS. 4A through 4D together illustrate an embodiment of a process for integrating optical dies on a substrate such as a printed circuit board (PCB) using underfill. FIG. 4A illustrates the optical device 300, which comprises an optical die 302 flip-chip bonded onto a substrate 304. In one embodiment of the device 300, the optical die 302 can be made of Gallium Arsenide (GaAs), which has a coefficient of thermal expansion of about 5.8 ppm/° C., while the substrate 304 can be a printed circuit board (PCB) typically made of materials having a higher coefficient of thermal expansion (alpha) of about 17 ppm/° C. Because of this mismatch in thermal expansion coefficients, and because during operation the device 300 can typically endure temperature rises of 100° C. or more, if the device 300 operates as it is shown in FIG. 4A it will be subject to large stress concentrations because there is no underfill between the optical die 302 and the substrate 304 to carry some of the thermally induced stresses. Additionally, without underfill debris and moisture can enter the volume between the die and the substrate and damage or impair the optically active area of the die.

Figure 4B:
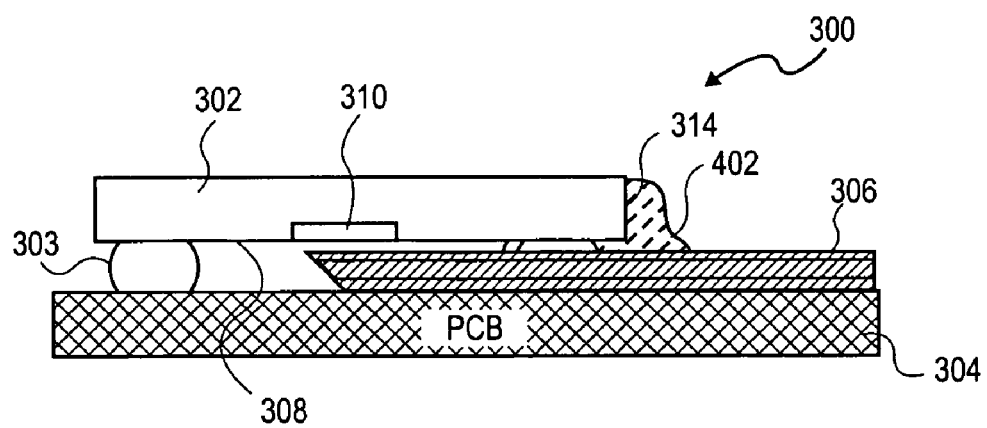

FIG. 4B illustrates a first step in the embodiment of the process. A bead of optically transparent material 402 is dispensed along the edge 314 of the optical die. As its name suggests, the optically transparent material should be optically transparent (i.e., it should absorb a minimum amount of radiation) at the operational wavelength of the optically active area 310. In one embodiment in which the optically active area 310 is a VCSEL the operational wavelength is typically 850 nm, although VCSELs can operate at other wavelengths, and in other embodiments the optically active area can be a different type of device operating at the same or different wavelengths. In addition to being optically transparent, the optically transparent material 402 should have a low coefficient of thermal expansion, and should have a modulus of elasticity (i.e., Young's modulus E) that is substantially lower than conventional underfill materials. The material 402 should also have a refractive index substantially equal to the refractive index of the waveguide 306 to prevent or minimize insertion losses. In one embodiment, the optically transparent material can be a silicon-based material such as a silicon adhesive, although in other embodiments materials such as acrylic or acrylic-based materials or certain epoxies can be used.

Figure 4C:
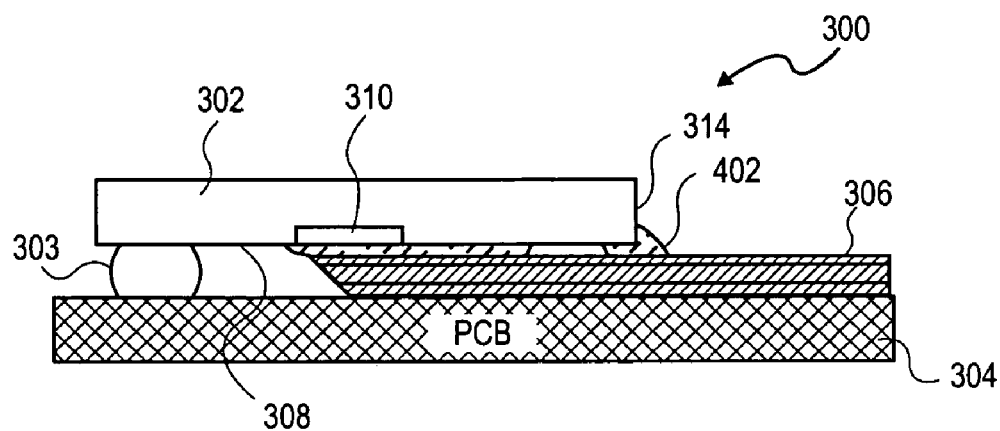

FIG. 4C illustrates the next step in the embodiment of the process. Because of the small scales involved and the small distance between the waveguide 306 and the surface 308 of the die, after the bead of the optically transparent material 402 is applied along the edge 314 of the die 302, capillary action causes the optically transparent material to be drawn into the volume between the waveguide 306 and the surface 308 of the die. In the embodiment shown, the capillary action draws the optically transparent material far enough under the die such that it fills the entire volume corresponding to the overlap area between the die and the waveguide. At the very least, the optically transparent material should occupy the volume between the optically active area 310 and the waveguide, so that radiation leaving or entering the waveguide or the optically active area 310 travels though the optically transparent material. In addition to the above-mentioned requirements for the optically transparent material, because the embodiment of the method relies on capillary action to draw the material 402 into the volume between the die and the waveguide, this creates an upper limit on the viscosity of the material 402. There is, however, no lower limit on the permissible viscosity of the material. When the optically transparent material occupies the desired areas between the die and the waveguide, the optically transparent material can be cured before continuing with the process, or can be cured after the conventional underfill is dispensed (see below).

Figure 4D:
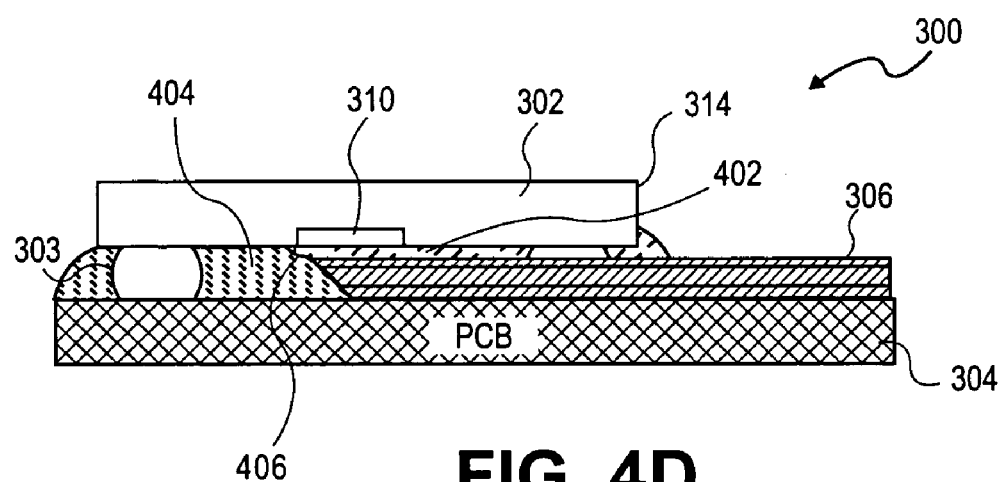

FIG. 4D illustrates the next step in the embodiment of the process. A conventional underfill material 404 is dispensed into the portion of the volume between the die and the substrate and the waveguide not already occupied by the optically transparent material. In the embodiment shown, the conventional underfill material occupies the portion of the volume between the substrate 304 and the surface 308 of the die, while the optically transparent material 402 occupies the portion of the volume between the waveguide and the surface 308 of the die. The conventional underfill 404 and the optically transparent material come into contact along an interface 406. The position of the interface 406 must be such that none of the conventional underfill material comes into contact with the optically active area 310 or impeded the transmission of radiation between the optically active area 310 and the waveguide. Although any underfill material can be used, typical conventional underfill materials are a combination of a resin and a filler mixed in a proportion that gives the desired or required physical properties. In one embodiment, the resin is an epoxy with a high coefficient of thermal expansion (e.g., 50–70 ppm/° C.) while the filler is silicon dioxide ($SiO_2$), which has a substantially lower coefficient of thermal expansion (e.g., 0.5 ppm/° C.); the resulting underfill material has a coefficient of thermal expansion of about 25 ppm/° C. and a modulus of elasticity of about 7–10 GPa. Since conventional underfill material is opaque and should not play a role in the function of the optically active area, there are no optical requirements for the conventional underfill as there are for the optically transparent material.

Once the optically transparent material 402 and the underfill material 404 have been dispensed into the volume between the optical die 302 and the substrate and waveguide, both the material and the underfill must be cured. In one embodiment, after they have been dispensed both the adhesive and the underfill are cured by placing the entire device 300 in an oven or autoclave and subjecting it to temperatures not exceeding 180° C. for an amount of time not exceeding one hour. In other embodiments, however, higher or lower temperatures and longer or shorter curing times can be used, as long as the curing temperature and time are not sufficient to harm the optically active area or any other component. In addition, in other embodiments the optically transparent material 402 and the underfill 404 need not be cured simultaneously. Instead, the optically transparent material can be cured first followed by dispensing and curing of the underfill or, alternatively, the underfill can be dispensed and cured first followed by dispensing and curing of the optically transparent material. Although generally more expensive and time consuming, separate curing of the optically transparent material and the underfill can have advantages, such as preventing any mixing of optically transparent material and underfill at the interface 406 before curing.

Figure 5:
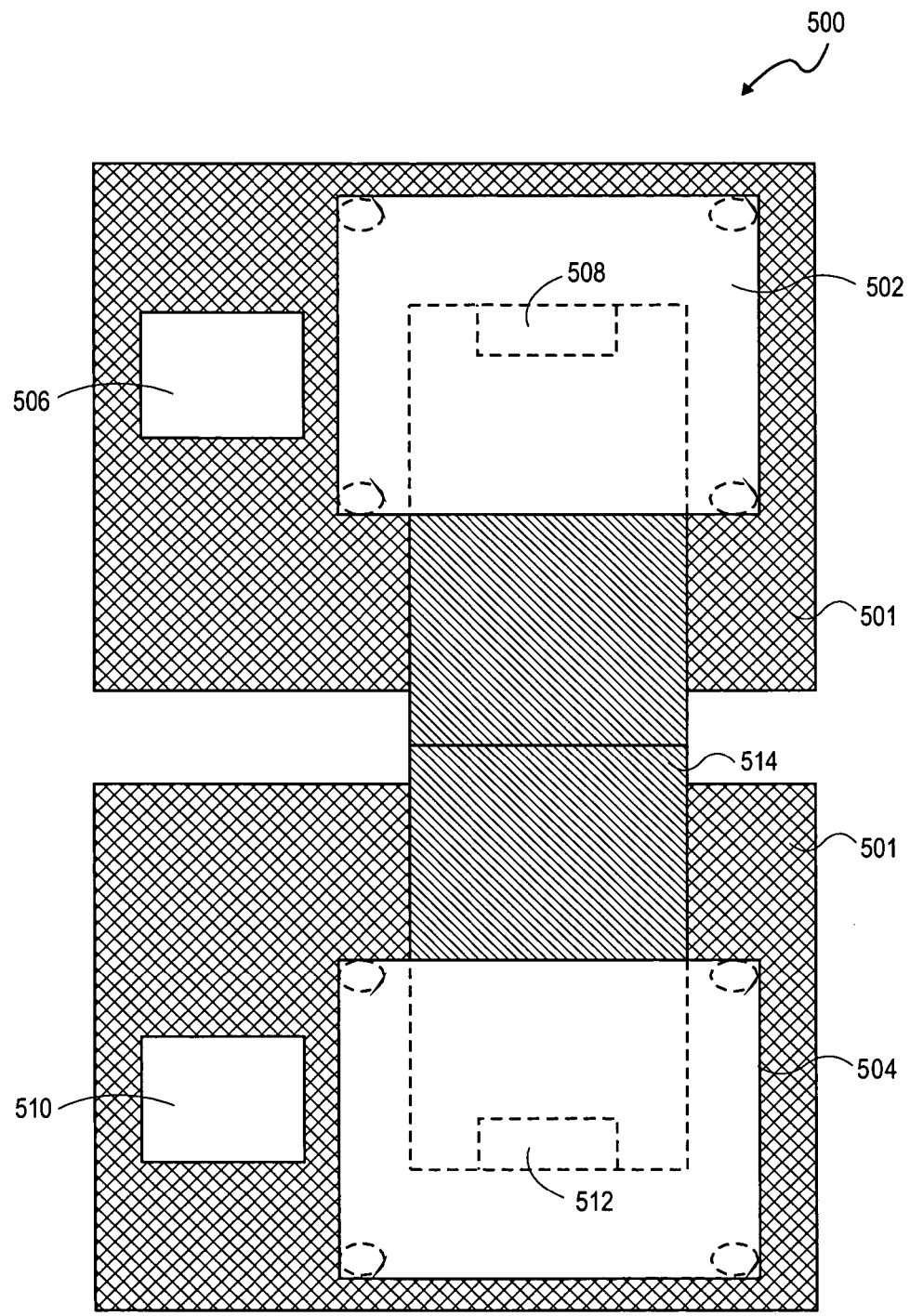
FIG. 5 is a plan view of an embodiment of an optical system including a pair of dies flip-chip bonded to a substrate and integrated thereto as shown in the embodiment depicted in FIG. 4A–4D.

FIG. 5 illustrates an embodiment of a system 500 including a first die 502 and a second die 504 flip-chip bonded to a substrate 501. The die 502 is coupled to a signal source 506 and includes an optically active area 508 that is an optical source. Similarly, the second die 504 is coupled to a signal destination 510 and includes an optically active area 512 that in this embodiment is an optical detector. A waveguide 514 extends between the first die 502 and the second die 504, and is positioned between each die and the substrate such that it can receive an optical signal from or transmit an optical signal to the optically active area of each die. Both dies 502 and 504 are flip-chip bonded to the substrate 501 and are integrated thereto using an optically transparent material and an underfill, substantially as shown in FIG. 4D. In operation, the signal source 506 generates a signal that is transmitted to the optical die 502. The optically active area 508 turns the signal into an optical signal and launches it into the waveguide 514. The signal travels through the waveguide to the optically active area 512, which detects the signal and transmits it to the signal destination 510.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
an optical die flip-chip bonded to a substrate and defining a volume between the optical die and the substrate, the optical die including an optically active area on a surface of the die facing the substrate;
an optically transparent underfill material occupying at least those portions of the volume substantially corresponding with the optical path of the optically active area; and
an opaque underfill material occupying portions of the volume not occupied by the optically transparent underfill material.

2. The apparatus of claim 1 wherein the optically active area is a detector or a source.

3. The apparatus of claim 1 wherein the optically transparent material has a low modulus of elasticity.

4. The apparatus of claim 1 wherein the optically transparent material is optically transparent at wavelengths between 800 nm and 1550 nm.

5. The apparatus of claim 4 wherein the optically transparent material is optically transparent at a wavelength of approximately 850 nm.

6. The apparatus of claim 1 wherein the optically transparent material has a refractive index of approximately 1.5.

7. The apparatus of claim 1 wherein the optically transparent material is an adhesive.

8. The apparatus of claim 7 wherein the optically transparent material is silicone-based.

9. An apparatus comprising:
an optical die flip-chip bonded to a substrate and defining a volume between the optical die and the substrate, the optical die including an optically active area on a surface of the die facing the substrate;
an optical component partially positioned in the volume between the optical die and the substrate to carry an optical signal to or receive an optical signal from the optically active area;
an optically transparent underfill material occupying those portions of the volume substantially in the optical path of the optically active area; and
an opaque underfill material occupying portions of the volume not occupied by the optically transparent underfill material and the optical component.

10. The apparatus of claim 9 wherein the optical component is a waveguide.

11. The apparatus of claim 9 wherein the optically active area is a detector or a source.

12. The apparatus of claim 9 wherein the optically transparent material has a refractive index substantially the same as a refractive index of the optical component.

13. The apparatus of claim 9 wherein the optically transparent material has a refractive index of approximately 1.5.

14. The apparatus of claim 9 wherein the optically transparent material has a low modulus of elasticity.

15. The apparatus of claim 9 wherein the optically transparent material is optically transparent at wavelengths between 800 nm and 1550 nm.

16. The apparatus of claim 15 wherein the optically transparent material is optically transparent at a wavelength of approximately 850 nm.

17. The apparatus of claim 9 wherein the optically transparent material is an adhesive.

18. The apparatus of claim 9 wherein the optically transparent material is silicone-based.

19. A system comprising:
a signal source;
a first optical die coupled to the signal source, the first optical die being flip-chip bonded to a substrate and defining a first volume between the first optical die and the substrate, the first optical die including an optically active area on a surface of the die facing the substrate;
a signal destination;
a second optical die coupled to the signal destination, the second optical die being flip-chip bonded to a substrate and defining a second volume between the second optical die and the substrate, the second optical die including an optically active area on a surface of the die facing the substrate;
an optical component extending between the first and second optical dies, the optical component partially positioned in the first and second volumes;
an optically transparent underfill material occupying those portions of the first and second volumes substantially in the optical paths of the optically active areas; and
an opaque underfill material positioned in the first and second volumes, the opaque underfill material occupying portions of the volumes not occupied by the optically transparent underfill material.

20. The system of claim 19 wherein the optical component is a waveguide.

21. The system of claim 19 wherein the optically active area of the first die is a source and the optically active area of the second die is a detector.

22. The system of claim 19 wherein the optically transparent material has a refractive index substantially the same as a refractive index of the optical component.

23. The system of claim 19 wherein the optically transparent material has a refractive index of approximately 1.5.

24. The system of claim 19 wherein the optically transparent material has a low modulus of elasticity.

25. The system of claim 19 wherein the optically transparent material is optically transparent at wavelengths between 800 nm and 1550 nm.

26. The system of claim 25 wherein the optically transparent material is optically transparent at a wavelength of approximately 850 nm.

* * * * *